US011937341B2

(12) United States Patent
Park

(10) Patent No.: US 11,937,341 B2
(45) Date of Patent: Mar. 19, 2024

(54) COOKING APPARATUS AND CONTROLLING METHOD THEREOF

(71) Applicant: Samsung Electronics Co., Ltd., Suwon-si (KR)

(72) Inventor: Kihyeon Park, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 876 days.

(21) Appl. No.: 17/003,647

(22) Filed: Aug. 26, 2020

(65) Prior Publication Data

US 2021/0068204 A1 Mar. 4, 2021

(30) Foreign Application Priority Data

Aug. 26, 2019 (KR) .................. 10-2019-0104728

(51) Int. Cl.
*H05B 1/02* (2006.01)
*F24C 7/08* (2006.01)
(Continued)

(52) U.S. Cl.
CPC ........... *H05B 1/0261* (2013.01); *F24C 7/082* (2013.01); *G01R 19/1659* (2013.01);
(Continued)

(58) Field of Classification Search
None
See application file for complete search history.

(56) References Cited

U.S. PATENT DOCUMENTS 5,662,025 A * 9/1997 Yoo ................ A47J 27/004
219/448.11
6,841,761 B1 * 1/2005 Banzato ............... F24C 15/106
219/486
(Continued)

FOREIGN PATENT DOCUMENTS

CN  108054778 B  6/2021
CN  109856509 B  8/2021
(Continued)

OTHER PUBLICATIONS

International Search Report and Written Opinion of the International Searching Authority in connection with International Application No. PCT/KR2020/009710 dated Nov. 6, 2020, 9 pages.
(Continued)

*Primary Examiner* — Thor S Campbell

(57) ABSTRACT

A cooking apparatus and a controlling method, where the cooking apparatus includes a plurality of power input terminals, a plurality of heaters, a detection circuit connected to the power input terminals for detecting the phase of power input into the power input terminals, and a processor. The processor configured to identify a phase difference of input power based on an electronic signal of the power output from the detection circuit, and, based on the phase difference being within one of a plurality of threshold ranges, identify the voltage between live terminals among the plurality of power input terminals based on the phase difference of the power and control at least one heater among the plurality of heaters according to the identified voltage between the live terminals, and, based on the phase difference being outside the plurality of threshold ranges, stop the operation of the cooking apparatus.

14 Claims, 9 Drawing Sheets

(51) Int. Cl.
*G01R 19/165* (2006.01)
*G01R 31/55* (2020.01)
*H02H 1/00* (2006.01)
*H02H 7/20* (2006.01)

(52) U.S. Cl.
CPC .......... *G01R 31/55* (2020.01); *H02H 1/0007* (2013.01); *H02H 7/20* (2013.01)

(56) References Cited

U.S. PATENT DOCUMENTS

| | | | | |
|---|---|---|---|---|
| 8,559,148 | B2* | 10/2013 | Yilmaz | G05B 9/02 |
| | | | | 361/90 |
| 8,786,315 | B2 | 7/2014 | Nesreen et al. | |
| 9,398,645 | B2* | 7/2016 | Gray | H05B 6/68 |
| 10,132,875 | B1* | 11/2018 | McAnelly | G01R 31/62 |
| 2009/0039072 | A1* | 2/2009 | Llona | H05B 1/0266 |
| | | | | 219/486 |
| 2009/0294434 | A1* | 12/2009 | Fonseca | H05B 1/0266 |
| | | | | 219/498 |
| 2018/0063901 | A1* | 3/2018 | Nachtom | H05B 6/687 |
| 2018/0367027 | A1* | 12/2018 | Chen | H02H 1/0007 |
| 2019/0165563 | A1* | 5/2019 | Epee | H02H 3/331 |
| 2019/0181635 | A1* | 6/2019 | Okumura | G01R 25/00 |

FOREIGN PATENT DOCUMENTS

| | | |
|---|---|---|
| JP | 2003-068441 A | 3/2003 |
| JP | 2008-267717 A | 11/2008 |
| JP | 4275840 B2 | 6/2009 |
| JP | 2010-107110 A | 5/2010 |
| JP | 2013-141550 A | 7/2013 |
| KR | 10-0146927 B1 | 8/1998 |
| KR | 10-0197730 B1 | 6/1999 |
| KR | 10-2002-0007668 A | 1/2002 |
| KR | 10-0746448 B1 | 8/2007 |
| KR | 10-1036287 B1 | 5/2011 |
| KR | 10-1906920 B1 | 12/2018 |
| WO | 2016/134776 A1 | 9/2016 |

OTHER PUBLICATIONS

European Patent Office, "Supplementary European Search Report," dated Jun. 24, 2022, in connection with European Patent Application No. 20859521.5, 11 pages.

* cited by examiner

PHASE DIFFERENCE 8.37MS
(a)

PHASE DIFFERENCE WITHIN 1MS
(b)

COOKING APPARATUS AND CONTROLLING METHOD THEREOF

CROSS-REFERENCE TO RELATED APPLICATION

This application is based on and claims priority under 35 U.S.C. § 119(a) to Korean Patent Application No. 10-2019-0104728 filed on Aug. 26, 2019 in the Korean Intellectual Property Office, the disclosure of which is incorporated by reference herein in its entirety.

BACKGROUND

1. Field

The disclosure relates to a cooking apparatus and a controlling method thereof, and more particularly, to a cooking apparatus that controls operations of a cooking apparatus based on a phase difference of input power, and a controlling method thereof.

2. Description of Related Art

In the case of a cooking apparatus product by a power connection method of three wires or four wires, power can be provided by connecting a power wire to the terminal of the product. In a cooking apparatus product, electronic components of which rated voltage is 120V (e.g., a motor, a lamp, a pump) and an electronic component of which rated voltage is 240V (a heater) are included. Accordingly, in case a power wire is wrongly connected to a terminal, 240V may be applied to an electronic component of which rated voltage is 120V, and burn-out and ignition may occur.

In the past, for preventing burn-out of an electronic component when overvoltage compared to the power specification of the electronic component is applied, an overvoltage detection circuit was added to a cooking apparatus. An overvoltage detection circuit is a circuit which identifies whether a voltage peak value of a rectified alternating current is higher than a predetermined restricted value. If it is identified that an overvoltage was applied through an overvoltage detection circuit, a cooking apparatus prevented burn-out of an electronic component by controlling the operation of the electronic component.

However, because of the characteristic of the method of detecting a peak value of an alternating current, there were limitations that an overvoltage detection circuit was vulnerable to external noises, and as there were various components necessary for implementing operations, the structure was complex. Also, there was a limitation that applying an overvoltage detection circuit to a cooking apparatus only for the purpose of determining misconnection when installing a cooking apparatus lead to low efficiency in terms of the material cost.

In addition, as a heater applied to a cooking apparatus has a fixed resistance value, power consumption may change according to an applied voltage. In the past, an oven cooking algorithm was developed based on 240V without detecting the specification of input power of a heater, and accordingly, there was a limitation that in the case of installing a cooking apparatus in an area wherein 208V was supplied, heating was poor due to the low output of the heater. Also, in the past, there was a limitation that in case a power specification to be detected was added, adding a circuit block for detecting the power specification was inevitable.

SUMMARY

A cooking apparatus according to an embodiment of the disclosure for achieving the aforementioned purpose may include a plurality of power input terminals, a plurality of heaters, a detection circuit which is connected to the power input terminals and for detecting the phase of power input into the power input terminals, and a processor configured to, based on an electric wire being connected to the plurality of power input terminals and power being input, identify the phase difference of the input power based on an electronic signal of the power output from the detection circuit, and based on the phase difference being within one of a plurality of threshold ranges, identify the voltage between live terminals among the plurality of power input terminals based on the phase difference of the power and control to operate at least one heater among the plurality of heaters according to the identified voltage between the live terminals, and based on the phase difference being outside the plurality of threshold ranges, control to stop the operation of the cooking apparatus.

Meanwhile, a method of controlling a cooking apparatus according to an embodiment of the disclosure for achieving the aforementioned purpose may include the steps of, based on an electric wire being connected to the plurality of power input terminals and power being input, identifying the phase difference of the input power based on an electronic signal of the power output from the detection circuit, and based on the phase difference being within one of a plurality of threshold ranges, identifying the voltage between live terminals among the plurality of power input terminals based on the phase difference of the power and controlling to operate at least one heater among the plurality of heaters according to the identified voltage between the live terminals, and based on the phase difference being outside the plurality of threshold ranges, controlling to stop the operation of the cooking apparatus.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely.

Moreover, various functions described below can be implemented or supported by one or more computer programs, each of which is formed from computer readable program code and embodied in a computer readable medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

Figure 1:
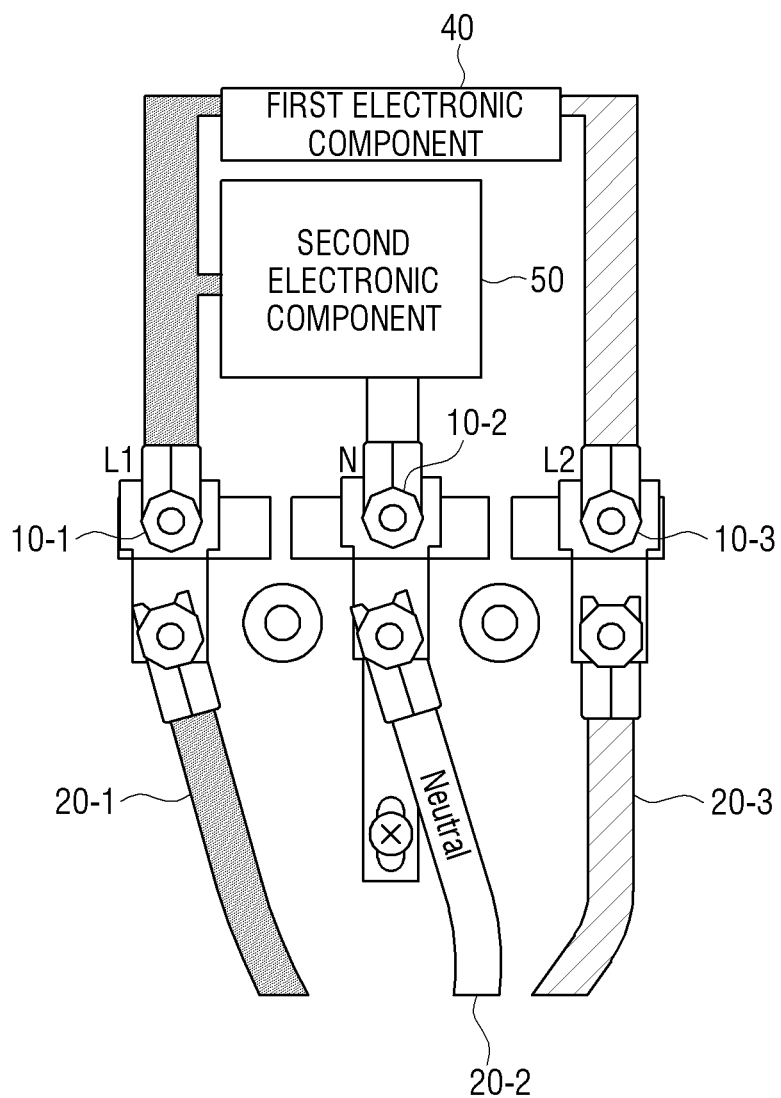
FIG. 1 is a diagram for illustrating a method of controlling a cooking apparatus according to an embodiment of the disclosure.

FIGS. 1 through 7, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device.

As terms used in the embodiments of the disclosure, general terms that are currently used widely were selected as far as possible, in consideration of the functions described in the disclosure. However, the terms may vary depending on the intention of those skilled in the art who work in the pertinent field, previous court decisions, or emergence of new technologies. Also, in particular cases, there are terms that were designated by the applicant on his own, and in such cases, the meaning of the terms will be described in detail in the relevant descriptions in the disclosure. Thus, the terms used in the disclosure should be defined based on the meaning of the terms and the overall content of the disclosure, but not just based on the names of the terms.

In the disclosure, expressions such as "have," "may have," "include" and "may include" should be construed as denoting that there are such characteristics (e.g.: elements such as numerical values, functions, operations and components), and the expressions are not intended to exclude the existence of additional characteristics.

Also, in the disclosure, the expression "at least one of A and/or B" should be understood to denote any one of "A" or "B" or "A and B."

In addition, the expressions "first," "second" and the like used in the disclosure may be used to describe various elements regardless of any order and/or degree of importance. Also, such expressions are used only to distinguish one element from another element, and are not intended to limit the elements.

The description in the disclosure that one element (e.g.: a first element) is "(operatively or communicatively) coupled with/to" or "connected to" another element (e.g.: a second element) should be interpreted to include both the case where the one element is directly coupled to the another element, and the case where the one element is coupled to the another element through still another element (e.g.: a third element).

Singular expressions also include plural expressions, as long as they do not obviously mean differently in the context. In addition, in the disclosure, terms such as "include" and "consist of" should be construed as designating that there are such characteristics, numbers, steps, operations, elements, components or a combination thereof described in the specification, but not to exclude in advance the existence or possibility of adding one or more of other characteristics, numbers, steps, operations, elements, components or a combination thereof.

In the disclosure, "a module" or "a part" performs at least one function or operation, and these elements may be implemented as hardware or software, or as a combination of hardware and software. Further, a plurality of "modules" or "parts" may be integrated into at least one module and implemented as at least one processor, except "modules" or "parts" that need to be implemented as specific hardware.

The disclosure was devised for improving the aforementioned problem, and the purpose of the disclosure is in providing a cooking apparatus that identifies the phase difference of input power, and controls to operate heaters or stops the entire operation based on the identified phase difference of the power, and a controlling method thereof.

Hereinafter, an embodiment of the disclosure will be described in more detail with reference to the drawings.

FIG. 1 is a diagram for illustrating a method of controlling a cooking apparatus according to an embodiment of the disclosure.

As illustrated in FIG. 1, the cooking apparatus 100 may include a plurality of power input terminals 10-1, 10-2, 10-3, and may receive input of power from electric wires 20-1, 20-2, 20-3 connected to the plurality of power input terminals 10-1, 10-2, 10-3. Also, to the first electronic component (e.g., a heater) 40 of the cooking apparatus 100, a voltage between an L1 terminal (a Live 1 terminal) 10-1 and an L2 terminal (a Live 2 terminal) 10-3 may be applied, and to the second electronic component (e.g., a motor, a lamp, a pump) 50, a voltage between the L1 terminal 10-1 and a neutral (N) terminal 10-2 may be applied.

The rated voltages of the first electronic component 40 and the second electronic component 50 according to an embodiment of the disclosure may respectively be 240V and 120V. Also, if the electric wires 20-1, 20-3 into which a voltage of 120V (the frequency is 60 Hz) is input are connected to the L1 terminal 10-1 and the L2 terminal 10-3, and the neutral line 20-2 is connected to the N terminal 10-2, rated voltages may respectively be applied to the first electronic component 40 and the second electronic component 50. However, in case the neutral line 20-2 is connected to another place which is not the N terminal 10-2, a rated voltage may not be applied to at least one of the first electronic component 40 or the second electronic component 50, and thus it may be burnt out or its output may be reduced. Accordingly, the cooking apparatus 100 may control such that the operation of the cooking apparatus 100 is stopped or at least one heater among the plurality of heaters 120 operates based on the phase difference of the input power.

If electric wires are connected to the plurality of power input terminals 10-1, 10-2, 10-3 according to an embodiment of the disclosure and power is input, the cooking apparatus 100 may identify the phase difference of the input power based on an electronic signal of the power. Specifically, the cooking apparatus 100 may perform half-rectification of an electronic signal of the power input into the plurality of power input terminals 10-1, 10-2, 10-3 and output a square wave of the electronic signal of the power. Then, the cooking apparatus 100 may detect the falling edge of the output square wave of the electronic signal, and detect the interval of the detected falling edge of the square wave of the electronic signal and identify the phase difference of the power. As an example, the cooking apparatus 100 may perform half-rectification of each of the electronic signals of the power between the L1 terminal 10-1 and the N terminal 10-2 (hereinafter, referred to as 'the L1-N power') and the power between the L2 terminal 10-3 and the N terminal 10-2 (hereinafter, referred to as 'the L2-N power') and output square waves of the electronic signals. Then, the cooking apparatus 100 may respectively detect the falling edges of the output square waves of the L1-N power and the L2-N power, and detect the interval between the detected falling edges of the square waves and identify the phase difference between the L1-N power and the L2-N power.

Then, if the phase difference of the power is within one of a plurality of threshold ranges, the cooking apparatus 100 may identify the voltage between the live terminals (the voltage between the L1 terminal and the L2 terminal) among the plurality of power input terminals based on the phase difference of the power. Specifically, if the identified phase difference of the power is within a first threshold range, the cooking apparatus 100 may identify the voltage between the live terminals as a first voltage corresponding to the first threshold range. Meanwhile, if the identified phase difference of the power is within a second threshold range, the cooking apparatus 100 may identify the voltage between the live terminals as a second voltage corresponding to the second threshold range. As an example, the first threshold range may be a ±10% error range of 8.33 ms (180 degrees when converted to an angle), and the second threshold range may be a ±10% error range of 5.55 ms (120 degrees when converted to an angle) or 11.1 ms (240 degrees when converted to an angle). However, this is merely an example, and the ±10% error range of 8.33 ms (180 degrees when converted to an angle) which is the first threshold range may be replaced with 8.33 ms which is the first threshold range, and the ±10% error range of 5.55 ms (120 degrees when converted to an angle) or 11.1 ms (240 degrees when converted to an angle) which is the second threshold range may be replaced with 5.55 ms or 11.1 ms which is the second threshold value.

Also, in case the phase difference of the power is 180 degrees, the cooking apparatus 100 may identify the voltage between the L1 terminal 10-1 and the L2 terminal 10-3 (hereinafter, referred to as 'the voltage between the live terminals') as the first voltage. Meanwhile, in case the power input into the L1 terminal 10-1 and the L2 terminal 10-3 has a phase difference of 180 degrees, power of a single-phase three-wire type delta connection is applied to the plurality of power input terminals 10-1, 10-2, 10-3, and thus the cooking apparatus 100 may identify the first voltage as 240V.

Meanwhile, in case the phase difference of the power is 120 degrees or 240 degrees, the cooking apparatus 100 may identify the voltage between the live terminals as the second voltage. Also, in case the power input into the L1 terminal 10-1 and the L2 terminal 10-3 has a phase difference of 120 degrees or 240 degrees, power of a three-phase four-wire type Y connection is applied to the plurality of power input terminals 10-1, 10-2, 10-3, and thus the cooking apparatus 100 may identify the second voltage as 208V.

Meanwhile, the cooking apparatus 100 may control to operate the heaters 120 as many as the number corresponding to the identified voltage. That is, the heaters 120 have a fixed resistance value, and thus power consumption output according to an applied voltage may change, and accordingly, the cooking apparatus 100 may control the number of the heaters 120 operating according to the identified voltage. Specifically, in case the voltage between the live terminals is identified as the first voltage, the cooking apparatus 100 may control to operate the heaters 120 of the first number corresponding to the first voltage. Meanwhile, in case the voltage between the live terminals is identified as the second voltage, the cooking apparatus 100 may control to operate the heaters 120 of the second number corresponding to the second voltage. Also, if the first voltage is bigger than the second voltage, the first number may be smaller than the second number.

As an example, in case the first voltage is 240V and the second voltage is 208V, the cooking apparatus 100 may control such that the number of the heaters 120 operating at 208V is bigger than the number of the heaters 120 operating at 240V. Accordingly, the cooking apparatus 100 may adjust output by varying the number of the heaters 120 operating during a preheating period according to the input voltage.

Meanwhile, in case the phase difference of the power is outside the plurality of threshold ranges, the cooking apparatus 100 may stop operating. The state wherein the phase difference of the power is outside the plurality of threshold ranges means a state wherein the electric wires 20-1, 20-2, 20-3 are wrongly connected to the plurality of power input terminals 10-1, 10-2, 10-3 (a state of misconnection). As an example, if an electric wire inputting a voltage of 120V (the frequency is 60 Hz) which is not a neutral line is connected to the N terminal 10-2, and a neutral line and an electric wire inputting a voltage of 120V (the frequency is 60 Hz) are respectively connected to the remaining L1 terminal 10-1 and L2 terminal 10-3, the phase difference of the power (the phase difference between the L1-N power and the L2-N power) may be identified as being outside the threshold ranges. Also, a voltage which is not a rated voltage may be applied to the plurality of electronic components 40, 50 included in the cooking apparatus 100. Accordingly, when the phase difference of the power is outside the plurality of threshold ranges, the cooking apparatus 100 may stop operating and thereby prevent burn-out and ignition of the electronic components 40, 50.

Also, as an example, in case the phase difference of the power is outside the plurality of threshold ranges, the cooking apparatus 100 may display a guide message or output a notification sound indicating that electric wires have been wrongly connected to the plurality of power input terminals.

Figure 2A:
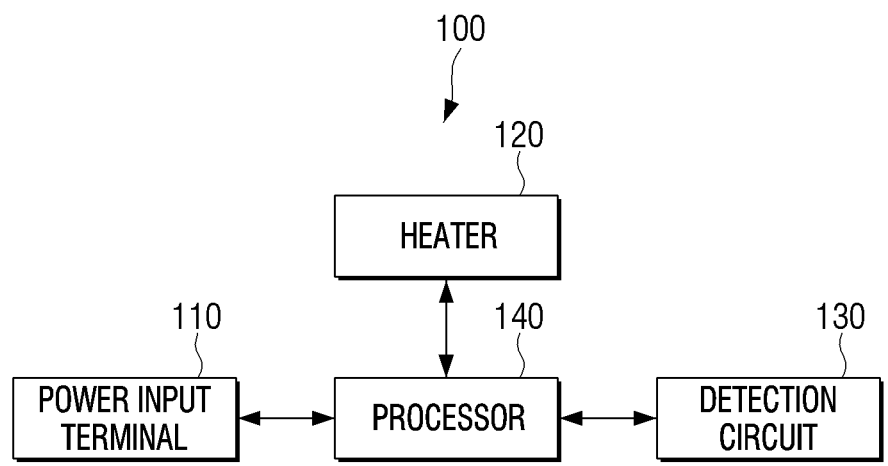
FIG. 2A is a block diagram illustrating a schematic configuration of a cooking apparatus according to an embodiment of the disclosure.

FIG. 2A is a block diagram illustrating a schematic configuration of the cooking apparatus 100 according to an embodiment of the disclosure. As illustrated in FIG. 2A, the cooking apparatus 100 may include a plurality of power input terminals 110, a plurality of heaters 120, a detection circuit 130, and a processor 140. Meanwhile, the components illustrated in FIG. 2A are an exemplary diagram for implementing the embodiments of the disclosure, and appropriate hardware/software components of a level obvious to a person having ordinary knowledge in the art may be additionally included in the cooking apparatus 100.

The plurality of power input terminals 110 may receive input of power from electric wires. As an example, the plurality of power input terminals 110 may receive input of power from a single-phase three-wire type delta connection or receive input of power from a three-phase four-wire type Y connection.

Also, the plurality of power input terminals 110 may be implemented as the L1 terminal and the L2 terminal (or, the Live 1 terminal and the Live 2 terminal), the N terminal (or, the neutral terminal) as illustrated in FIG. 1, but this is merely an example.

The plurality of heaters 120 may generate heat for cooking food. According to an embodiment of the disclosure, the heaters 120 may include a bake heater, a broil heater, and a convection heater that forcefully circulates heat with a rotating fan, etc. Also, by control by the processor 140, at least one heater among the plurality of heaters 120 may operate.

The detection circuit 130 is a circuit for detecting the phase of the power input into the plurality of input terminals 110. Also, the detection circuit 130 may be connected between the L1 terminal and the N terminal and between the L2 terminal and the N terminal.

In addition, the detection circuit 130 may perform half-rectification of each of the electronic signals of input power (e.g., the L1-N power and the L2-N power) and output square waves of the electronic signals. Also, the detection circuit 130 may transfer the square waves of the electronic signals to the processor 140 through an insulating element. The detailed configuration and operation of the detection circuit 130 will be described with reference to FIG. 3.

The processor 140 may perform the overall control operations of the cooking apparatus 100. Specifically, when electric wires are connected to the plurality of power input terminals 110 and power is input, the processor 140 may identify the phase difference of the input power based on the electronic signal of the power output from the detection circuit 130. Specifically, the processor 140 may detect the falling edge of the square wave of the electronic signal output from the detection circuit 130, and detect the interval of the detected falling edge of the square wave of the electronic signal and identify the phase difference of the power. As an example, the processor 140 may detect the time point of the falling edge of the square wave of the L1-N power and the time point of the falling edge of the square wave of the L2-N power, and detect the interval of each time point of the falling edge and identify the phase difference of the power. A detailed method in this regard will be described with reference to FIG. 4A and FIG. 4B.

Also, if the phase difference of the power is within one of the plurality of threshold ranges, the processor 140 may identify the voltage between the live terminals based on the phase difference of the power. Specifically, if the phase difference of the power is within the first threshold range, the processor 140 may identify the voltage between the live terminals as the first voltage corresponding to the first threshold range, and if the phase difference is within the second threshold range, the processor 140 may identify the voltage between the live terminals as the second voltage corresponding to the second threshold range. As an example, in case the identified phase difference of the power is within a ±10% error range of 8.33 ms (180 degrees when converted to an angle) which is the first threshold range, the processor 140 may identify the voltage between the live terminals as 240V which is the first voltage corresponding to the first threshold range. Meanwhile, in case the identified phase difference of the power is within a ±10% error range of 5.55 ms (120 degrees when converted to an angle) or 11.1 ms (240 degrees when converted to an angle) which is the second threshold range, the processor 140 may identify the voltage between the live terminals as 208V which is the second voltage corresponding to the second threshold range.

Also, the processor 140 may control to operate heaters of a number corresponding to the identified voltage. Specifically, in case the identified voltage is the first voltage, the processor 140 may control to operate heaters of the first number corresponding to the first voltage. Also, in case the identified voltage is the second voltage, the processor 140 may control to operate heaters of the second number corresponding to the second voltage. In addition, if the first voltage is bigger than the second voltage, the first number may be smaller than the second number. As an example, if the first voltage is 240V and the second voltage is 208V, the number of the heaters that the processor 140 controls to operate when 240 V is applied may be smaller the number when 208V is applied. For example, if 240V is applied, the processor 140 may control to operate a bake heater and a convection heater, and when 208V is applied, the processor 140 may control to operate a bake heater and two convection heaters.

Meanwhile, if the phase difference of the power is outside the plurality of threshold ranges, the processor 140 may control to stop the operation of the cooking apparatus 100. If the phase difference of the power is outside the plurality of threshold ranges, electric wires inputting power into the plurality of input terminals 110 have been wrongly input. Thus, the processor 140 may control to stop the operation of the cooking apparatus 100 for preventing a phenomenon that a voltage which is not a rated voltage is applied to the electronic components of the cooking apparatus 100 and the electronic components are burnt out.

According to an embodiment of the disclosure, if the phase difference of the power is outside the plurality of threshold ranges, the processor 140 may control the display 160 to display a guide message indicating that electric wires have been wrongly connected to the plurality of power input terminals 110. Also, the processor 140 may control the speaker 170 to output a notification sound indicating that electric wires have been wrongly connected to the plurality of power input terminals 110.

Meanwhile, the processor 140 may be implemented as a digital signal processor (DSP) processing digital image signals, a microprocessor, and a time controller (TCON).

However, the disclosure is not limited thereto, and the processor 140 may include one or more of a central processing unit (CPU), a micro controller unit (MCU), a micro processing unit (MPU), a controller, an application processor (AP) or a communication processor (CP), and an ARM processor, or may be defined by the terms. Also, the processor 140 may be implemented as a system on chip (SoC) having a processing algorithm stored therein or large scale integration (LSI), or in the form of a field programmable gate array (FPGA). In addition, the processor 140 may perform various functions by executing computer executable instructions stored in the memory 190.

Figure 2B:
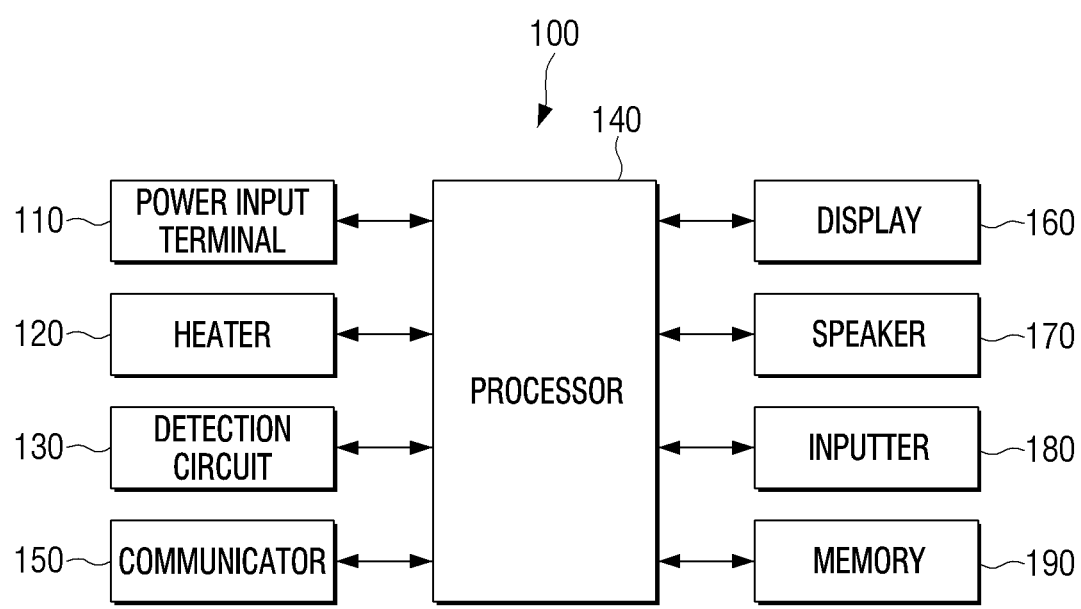
FIG. 2B is a block diagram illustrating a detailed configuration of a cooking apparatus according to an embodiment of the disclosure.

FIG. 2B is a block diagram illustrating a detailed configuration of the cooking apparatus 100 according to an embodiment of the disclosure. As illustrated in FIG. 2B, the cooking apparatus 100 may include a plurality of power input terminals 110, a heater 120, a detection circuit 130, a processor 140, a communicator 150, a display 160, a speaker 170, an inputter 180, and a memory 190. Meanwhile, as the plurality of power input terminals 110, the heater 120, the detection circuit 130, and the processor 140 were described in FIG. 2A, overlapping explanation will be omitted.

The communicator 150 may perform communication with an external apparatus through various communication methods. Communicative connection between the communicator 150 and an external apparatus may include performing communication through a third apparatus (e.g., a repeater, a hub, an access point, a server, or a gateway, etc.).

Meanwhile, the communicator 150 may include various communication modules for performing communication with an external apparatus. As an example, the communicator 150 may include a wireless communication module, and for example, it may include a cellular communication module using at least one of LTE, LTE Advanced (LTE-A), code division multiple access (CDMA), wideband CDMA (WCDMA), or Global System for Mobile Communications (GSM), etc. As another example, a wireless communication module may include, for example, at least one of wireless fidelity (WiFi), Bluetooth, Bluetooth low energy (BLE), Zigbee, Magnetic Secure Transmission, or radio frequency (RF).

The display 160 may display various information according to control by the processor 140. In particular, if the phase difference of the power is outside the plurality of threshold ranges, the display 160 may display a guide message indicating that electric wires have been wrongly connected to the plurality of power input terminals 110 by control by the processor 140.

Also, the display 160 may be implemented as a touch screen together with a touch panel. However, the display 160 is not limited to the aforementioned implementations, but may be implemented differently according to the type of the cooking apparatus 100.

The speaker 170 is a component outputting not only various kinds of audio data for which various processing operations such as decoding or amplification, and noise filtering, etc. were performed by an audio processor, but also various kinds of notification sounds or voice messages. In particular, if the phase difference of the power is outside the plurality of threshold ranges, the speaker 170 may output a notification sound indicating that electric wires have been wrongly connected to the plurality of power input terminals 110 by control by the processor 140. Meanwhile, the speaker 170 is merely an example, and it may be implemented as another output terminal that can output audio data.

The inputter 180 may receive various user inputs and transfer them to the processor 140. Specifically, the inputter 180 may include a touch sensor, a (digital) pen sensor, a pressure sensor, a key, or a microphone.

The inputter 180 may acquire an input signal according to a user instruction input through a UI. Also, the inputter 180 may transfer the input signal to the processor 140.

The memory 190 may store programs or data for controlling the cooking apparatus 100. Specifically, the memory 190 may store control programs or control data for controlling the cooking apparatus 100, or memorize a user manipulation input or a functional instruction input through the inputter 180, a control signal output by the processor 140, etc. Also, the memory 190 may be implemented as a non-volatile memory, a volatile memory, a flash-memory, a hard disc drive (HDD) or a solid state drive (SSD), etc. In addition, the memory 190 may be accessed by the processor 140, and reading/recording/correction/deletion/update, etc. of data by the processor 140 may be performed. Meanwhile, in the disclosure, the term memory may include the memory 190, a ROM inside the processor 140, a RAM, or a memory card (e.g., a micro SD card, a memory stick) installed on the cooking apparatus 100.

Figure 3:
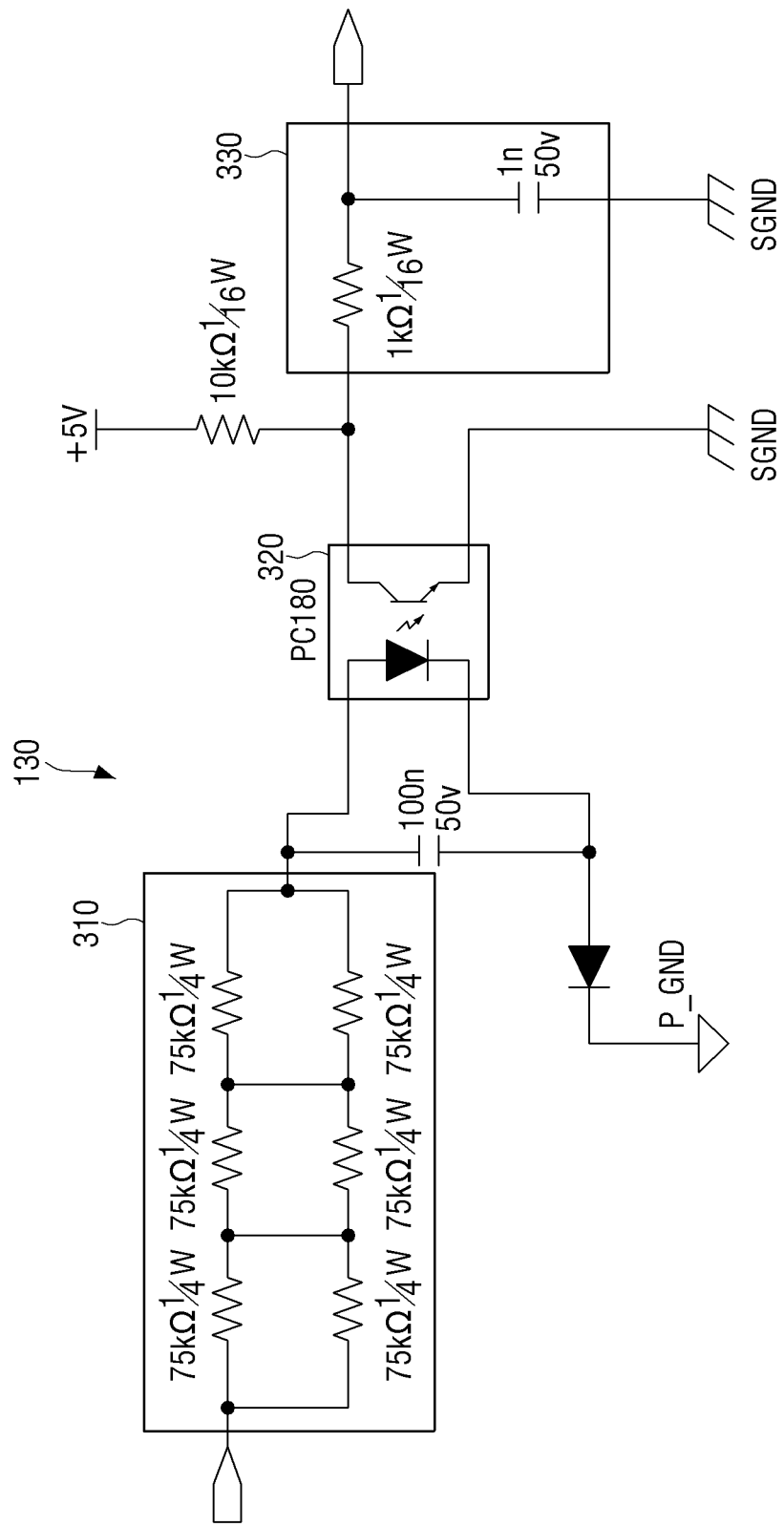
FIG. 3 is a diagram illustrating a detailed configuration of a detection circuit according to an embodiment of the disclosure.

FIG. 3 is a diagram illustrating a detailed configuration of the detection circuit 130 according to an embodiment of the disclosure. Meanwhile, the types of the elements constituting the detection circuit 130 and the numerical values of the elements illustrated in FIG. 3 are merely an example, and the types and the numerical values can obviously be implemented in various ways.

According to an embodiment of the disclosure, the input resistance 310 of the detection circuit 130 may reduce the current and voltage values of the electronic signal of the input power as much as a predetermined value. Also, the photo coupler 320 of the detection circuit 130 is an element that can transfer the electronic signal of the power to the light, and it may be implemented as a light emitting diode and a transistor. In addition, between a light emitting diode and a transistor, an insulating material may be included. The photo coupler 320 may perform half-rectification of the electronic signal of the power and output a square wave. Also, in the low frequency pass filter (low-pass filter) 330 of the detection circuit 130, the signal of the high frequency portion of the square wave may be removed.

Figure 4A:
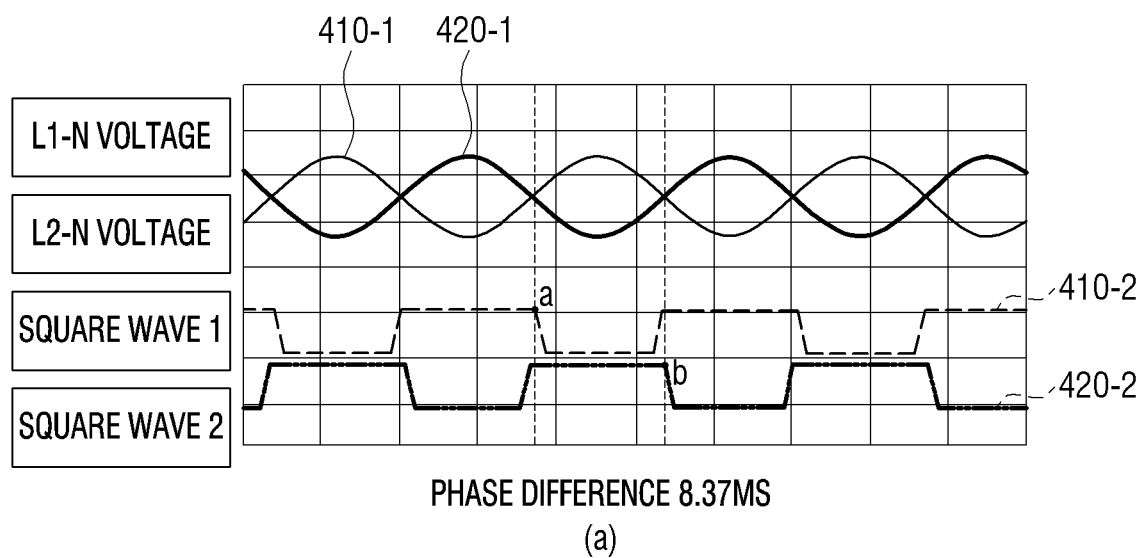
FIG. 4A is a diagram for illustrating a process wherein a cooking apparatus identifies the phase difference of power according to an embodiment of the disclosure.
Figure 4A:
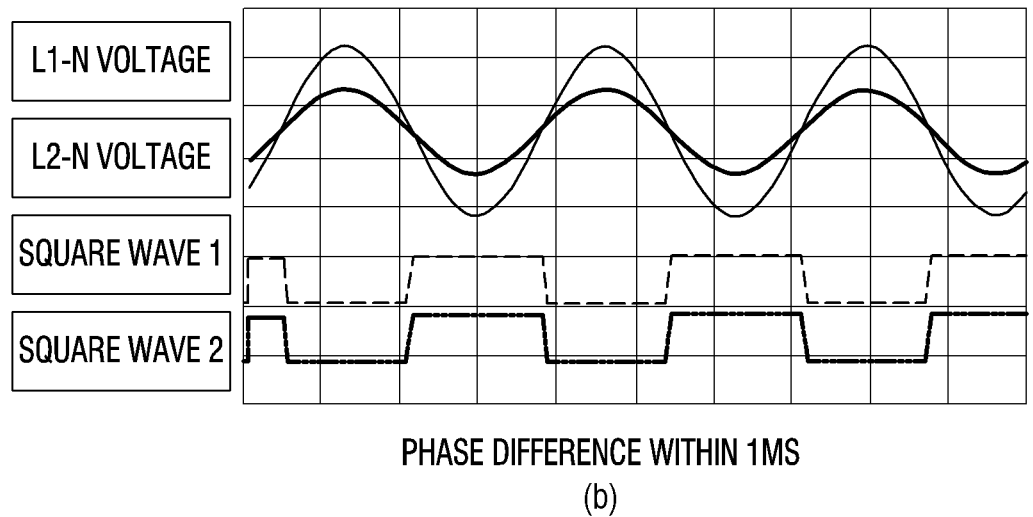
Figure 4B:
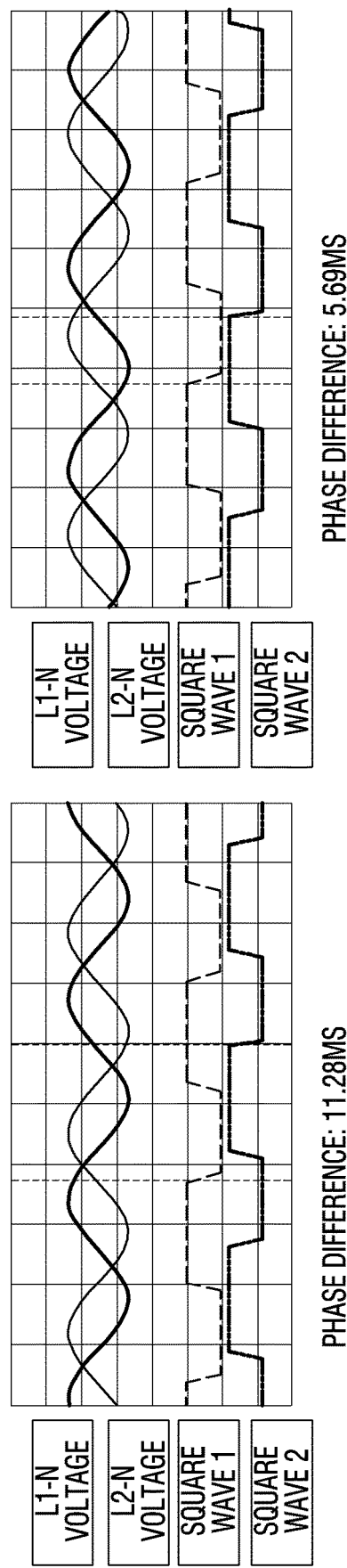
FIG. 4B is a diagram for illustrating a process wherein a cooking apparatus identifies the phase difference of power according to an embodiment of the disclosure.
Figure 4B:
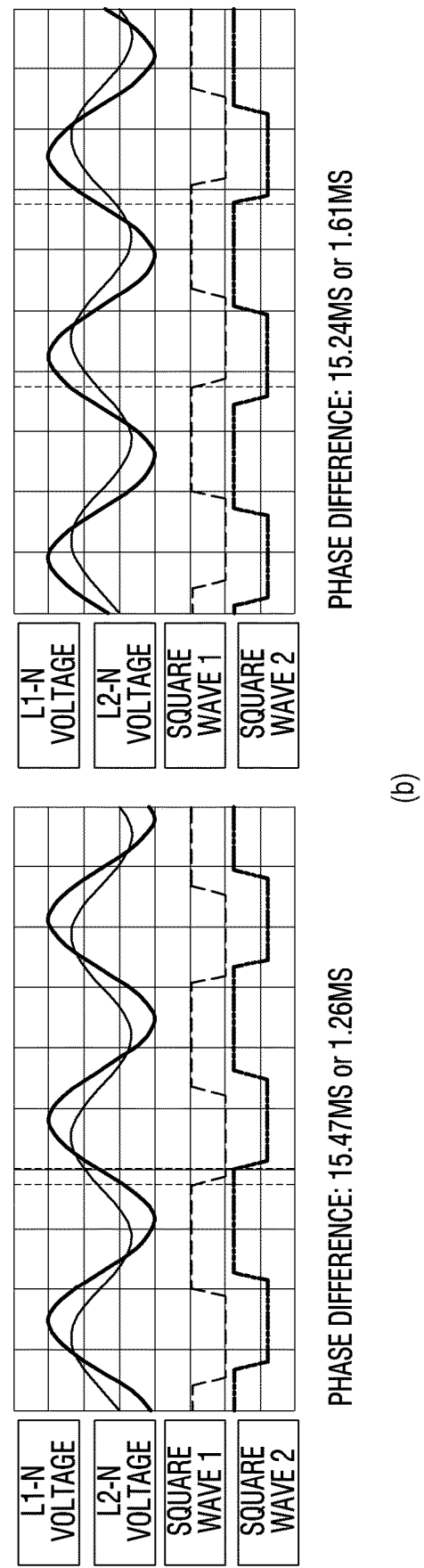

FIG. 4A and FIG. 4B are diagrams for illustrating a process wherein the cooking apparatus 100 identifies the phase difference of power according to an embodiment of the disclosure.

As an example, (a) in FIG. 4A and (a) in FIG. 4B are diagrams for illustrating a process wherein the cooking apparatus 100 identifies the phase difference of the power when an electric wire inputting an alternating voltage of 120V (the frequency is 60 Hz) is connected to the L1 and L2 terminals among the plurality of power input terminals and a neutral line is connected to the N terminal. The cooking apparatus 100 may perform half-rectification of each of the electronic signal 410-1 of the L1-N power and the electronic signal 420-1 of the L2-N power and output square waves 410-2, 420-2. Then, the cooking apparatus 100 may detect the falling edges a, b of each square wave 410-2, 420-2, and detect the interval between the detected falling edges and identify the phase difference of the L1-N power and the L2-N power.

Then, if the phase difference of the power is within one of the plurality of threshold ranges, the cooking apparatus 100 may identify the voltage between the live terminals as the voltage corresponding to the threshold range. Specifically, if the phase difference of the power is within the first threshold range, the cooking apparatus 100 may identify the voltage between the live terminals as the first voltage corresponding to the first threshold range, and if the phase difference of the power is within the second threshold range, the cooking apparatus 100 may identify the voltage between the live terminals as the second voltage corresponding to the second threshold range. For example, the first threshold range may be a ±10% error range of 8.33 ms (180 degrees when converted to an angle), and the second threshold range may be a ±10% error range of 5.55 ms (120 degrees when converted to an angle) or 11.1 ms (240 degrees when converted to an angle).

In case the phase difference of the power was identified as 8.37 ms as illustrated in (a) of FIG. 4A, the cooking apparatus 100 may identify that the phase difference of the power is within the first threshold range among the plurality of threshold ranges. Then, the cooking apparatus 100 may identify the voltage between the electric wires as the voltage corresponding to the ±10% error range of 8.33 ms which is the first threshold range. In case the phase difference between the power is 180 degrees, power has been input from a single-phase three-wire type delta connection, and thus the cooking apparatus 100 may identify the voltage between the live terminals as 240V.

Meanwhile, in case the phase difference of the power was identified as 11.28 ms or 5.69 ms as illustrated in (a) of FIG. 4B, the cooking apparatus 100 may identify that the phase difference of the power is within the second threshold range among the plurality of threshold ranges. Also, in case the identified phase difference between the power is within the ±10% error range of one of 5.55 ms (120 degrees when converted to an angle) or 11.1 ms (240 degrees when converted to an angle), power has been input from a three-phase four-wire type Y connection, and thus the cooking apparatus 100 may identify that the voltage between the electric wires is 208V.

Meanwhile, according to an embodiment of the disclosure, (b) in FIG. 4A and (b) in FIG. 4B are diagrams for illustrating a process wherein the cooking apparatus 100 identifies the phase difference of the power when an electric wire applying an alternating voltage of 120V (the frequency is 60 Hz) is connected to the L1 and N terminals among the plurality of power input terminals and a neutral line is connected to the L2 terminal.

As an example, as illustrated in (a) of FIG. 4B, the cooking apparatus 100 may identify that the phase difference of the L1-N power and the L2-N power is within 1 ms by the same method as the method in (a) in FIG. 4A. If the phase difference of the power is 1 ms, it is outside the plurality of threshold ranges, and thus the cooking apparatus 100 may stop operating.

As another example, as illustrated in (b) of FIG. 4B, the cooking apparatus 100 may identify that the phase difference of the L1-N power and the L2-N power is 15.47 ms or 1.26 ms, or 15.24 ms or 1.61 ms. As the identified phase difference is outside the plurality of threshold ranges, the cooking apparatus 100 may stop operating.

That is, in case the phase difference of the power is not within one of the plurality of threshold ranges (the ±10% error range of 8.33 ms, 5.55 ms and 11.1 ms), the cooking apparatus 100 may stop operating.

Figure 5:
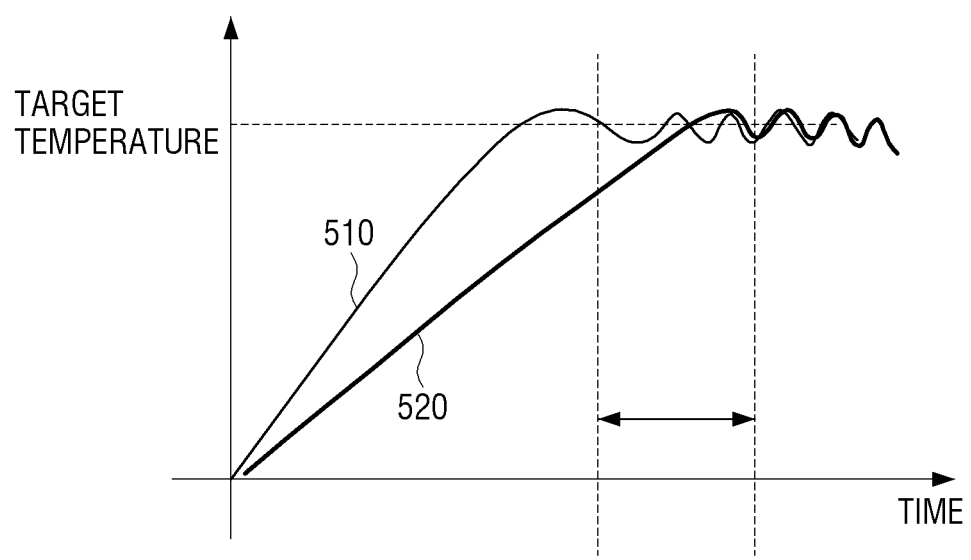
FIG. 5 is a diagram for illustrating an operation of a cooking apparatus in case the phase difference of power is outside a threshold range according to an embodiment of the disclosure.

FIG. 5 is a diagram for illustrating a process wherein the cooking apparatus 100 controls the heaters 120 according to an embodiment of the disclosure. As described with reference to FIG. 4, if the phase difference of the power is within the threshold range, the cooking apparatus 100 may identify a voltage corresponding to the threshold range. Also, the cooking apparatus 100 may control to operate heaters of a number corresponding to the identified voltage. As detailed explanation in this regard was made with reference to FIG. 1, overlapping explanation will be omitted.

In case the identified first voltage is 240V and the second voltage is 208V according to an embodiment of the disclosure, the number of heaters that the cooking apparatus 100 controls to operate when 240V is input may be smaller than the number of heaters that the cooking apparatus 100 controls to operate when 208V is input. For example, if the heaters that the cooking apparatus 100 controls to operate when the applied voltage is 240V are a bake heater and a convection heater, the heaters that the cooking apparatus 100 controls to operate when the applied voltage is 208V may be a bake heater and two convection heaters.

As an example, FIG. 5 illustrates a graph regarding the time that is taken for the temperature to rise to the target temperature according to the voltage input into the cooking apparatus 100. Referring to the graph 510 illustrated in FIG. 5, in case the input voltage is 240V, the cooking apparatus 100 may control to operate a bake heater and a convection heater and output power consumption of approximately 4300 W, and time as much as t1 may be taken to reach the target temperature. Also, referring to the graph 520 illustrated in FIG. 5, in case the input voltage is 208V, the cooking apparatus 100 may control to operate a bake heater and a convection heater and output power consumption of approximately 3230 W, and time as much as t2 which is bigger than t1 may be taken to reach the target temperature. That is, comparing the case wherein the input voltage is 240V and the case wherein the input voltage is 208V, in case the cooking apparatus 100 controls to operate heaters of the same number, a difference in power consumption of approximately 1070 W occurs, and for the temperature to rise to the target temperature, time as much as t2−t1 may be further taken. Accordingly, when the applied voltage is 208V, the cooking apparatus 100 may operate one more convection heater and output power consumption of approximately 4200 W, and reduce the time taken to reach the target temperature as much as a predetermined time.

Figure 6:
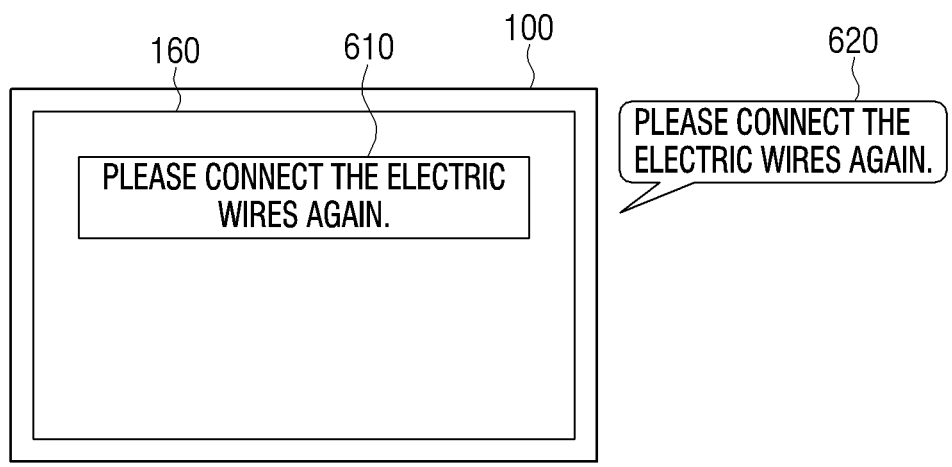
FIG. 6 is a diagram for illustrating a process wherein a cooking apparatus controls a heater according to an embodiment of the disclosure.

FIG. 6 is a diagram for illustrating an operation of a cooking apparatus in case the phase difference of power is outside a threshold range according to an embodiment of the disclosure. When it is identified that the phase difference of the power is outside a threshold range by the method described with reference to FIG. 4, the cooking apparatus 100 may display a guide message 610 indicating that electric wires have been wrongly connected to the plurality of power input terminals. As illustrated in FIG. 5, the guide message 610 may include a message 'please connect the electric wires again,' but this is merely an example.

As another example, if it is identified that the phase difference of the power is outside the threshold range, the cooking apparatus 100 may output a notification sound 620 indicating that electric wires have been wrongly connected to the plurality of power input terminals. As illustrated in FIG. 5, the notification sound 620 may output a voice corresponding to a message 'please connect the electric wires again,' but this is merely an example.

Figure 7:
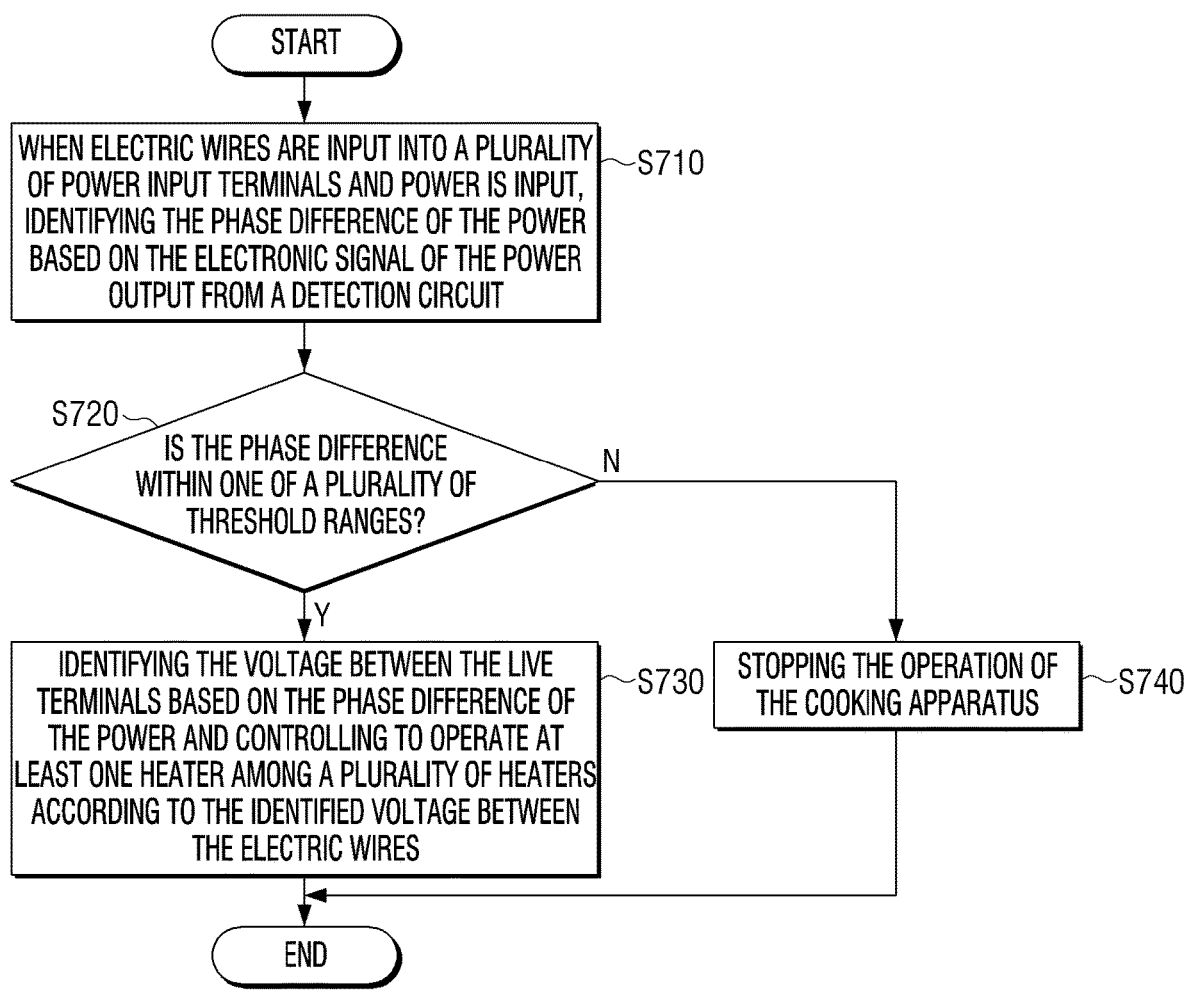
FIG. 7 is a flow chart for illustrating a method of controlling a cooking apparatus according to an embodiment of the disclosure.

FIG. 7 is a flow chart for illustrating a method of controlling the cooking apparatus 100 according to an embodiment of the disclosure.

First, when electric wires are input into the plurality of power input terminals 110 and power is input, the cooking apparatus 100 may identify the phase difference of the power based on the electronic signal of the power output from the detection circuit 130 at operation S710. Specifically, the detection circuit 130 may perform half-rectification of the electronic signals of the power input into the power input terminals (e.g., the L1-N power and the L2-N power) and output square waves of the electronic signals of the power. Then, the cooking apparatus 100 may detect the falling edges of the square waves of the electronic signals output from the detection circuit 130, and detect the interval of the detected falling edges of the square waves of the electronic signals and identify the phase difference of the power (e.g., the phase difference between the L1-N power and the L2-N power).

Then, the cooking apparatus 100 may identify whether the detected phase difference of the power is within one of the plurality of threshold ranges at operation 5720. As an example, the cooking apparatus 100 may identify whether the phase difference of the power is within a ±10% error range of one of 8.33 ms (180 degrees when converted to an angle) which is the first threshold range, or 5.55 ms (120 degrees) or 11.1 ms (240 degrees) which is the second threshold range. However, this is merely an example, and the first threshold range may be replaced with the first threshold range which is 8.33 ms, and the second threshold range may be replaced with the second threshold range which is 5.55 ms or 11.1 ms.

In case the phase difference of the power is within one of the plurality of threshold ranges, the cooking apparatus 100 may identify the voltage between the live terminals based on the phase difference of the power, and control to operate at least one heater among the plurality of heaters according to the identified voltage between the live terminals at operation 5730. Specifically, if the phase difference is within the first threshold range among the plurality of threshold ranges, the cooking apparatus 100 may identify the voltage between the live terminals as the first voltage corresponding to the first threshold range, and control to operate heaters of the first number corresponding to the first voltage. Meanwhile, if the phase difference is within the second threshold range among the plurality of threshold ranges, the cooking apparatus 100 may identify the voltage between the live terminals as the second voltage corresponding to the second threshold range, and control to operate heaters of the second number corresponding to the second voltage. Also, if the first voltage is bigger than the second voltage, the first number may be smaller than the second number.

Meanwhile, if the phase difference of the power is outside the plurality of threshold ranges, the cooking apparatus 100 may stop operating at operation 5740. Also, as an example, the cooking apparatus 100 may display a guide message indicating that electric wires have been wrongly connected to the plurality of power input terminals. As another example, the cooking apparatus 100 may output a notification sound indicating that electric wires have been wrongly connected to the plurality of power input terminals.

As described above, by the various embodiments of the disclosure, a cooking apparatus may be implemented as a circuit which is cheap and has a simple structure compared to an overvoltage detection circuit, and as burn-out and ignition of electronic components by misconnection are prevented, and the number of operating heaters varies according to the specification of the input power, a user can use a cooking apparatus safely and efficiently.

The various embodiments of the disclosure may be implemented as software including instructions stored in machine-readable storage media, which can be read by machines (e.g.: computers). Here, the machines refer to apparatuses that call instructions stored in a storage medium, and can operate according to the called instructions, and the apparatuses may include an electronic apparatus (e.g.: the cooking apparatus 100) according to the aforementioned embodiments. In case an instruction is executed by a processor, the processor may perform a function corresponding to the instruction by itself, or by using other components under its control. An instruction may include a code that is generated or executed by a compiler or an interpreter. A storage medium that is readable by machines may be provided in the form of a non-transitory storage medium. Here, the term 'non-transitory' means that a storage medium does not include signals, and is tangible, but does not indicate whether data is stored in the storage medium semi-permanently or temporarily. For example, 'a non-transitory storage medium' may include a buffer wherein data is temporarily stored.

Also, according to an embodiment of the disclosure, the method according to the various embodiments described in the disclosure may be provided while being included in a computer program product. A computer program product refers to a product, and it can be traded between a seller and a buyer. A computer program product can be distributed on-line in the form of a storage medium that is readable by machines (e.g.: a compact disc read only memory (CD-ROM)), or through an application store (e.g.: Play Store™). In the case of on-line distribution, at least a portion of a computer program product (e.g.: a downloadable app) may be stored in a storage medium such as the server of the manufacturer, the server of the application store, and the memory of the relay server at least temporarily, or may be generated temporarily.

In addition, each of the components (e.g.: a module or a program) according to the various embodiments may consist of a singular object or a plurality of objects. Also, among the aforementioned corresponding sub components, some sub components may be omitted, or other sub components may be further included in the various embodiments. Generally or additionally, some components (e.g.: a module or a program) may be integrated as an object, and perform functions performed by each of the components before integration identically or in a similar manner. Further, operations performed by a module, a program, or other components according to the various embodiments may be executed sequentially, in parallel, repetitively, or heuristically. Or, at least some of the operations may be executed in a different order or omitted, or other operations may be added.

Although the present disclosure has been described with various embodiments, various changes and modifications may be suggested to one skilled in the art. It is intended that the present disclosure encompass such changes and modifications as fall within the scope of the appended claims.

What is claimed is:
1. A cooking apparatus comprising:
  a plurality of power input terminals including at least a first live terminal, a second live terminal, and a neutral terminal;
  a plurality of heaters;
  a detection circuit connected to the plurality of power input terminals and configured to:
    perform half-rectification of each of a first electronic signal of the power between the first live terminal and the neutral terminal and a second electronic signal of the power between the second live terminal and the neutral terminal; and
    output a first square wave of the first electronic signal a second square wave of the second electronic signal; and a processor configured to:
- detect falling edges of the first and the second square waves output from the detection circuit;
- detect an interval between the detected falling edges of the first and second square waves;
- based on an electric wire being connected to the plurality of power input terminals and power being input, identify a phase difference of the input power based on the interval;
- based on the phase difference being within one of a plurality of threshold ranges, identify a voltage between live terminals among the plurality of power input terminals based on the phase difference of the power and control to operate at least one heater among the plurality of heaters according to the identified voltage between the live terminals; and
- based on the phase difference being outside the plurality of threshold ranges, control to stop the operation of the cooking apparatus.

2. The cooking apparatus of claim 1, wherein the processor is further configured to, based on the phase difference being within a first threshold range, identify the voltage between the live terminals as a first voltage corresponding to the first threshold range and control to operate heaters of a first number corresponding to the first voltage.

3. The cooking apparatus of claim 2, wherein the processor is further configured to, based on the phase difference being within a second threshold range, identify the voltage between the live terminals as a second voltage corresponding to the second threshold range and control to operate heaters of a second number corresponding to the second voltage.

4. The cooking apparatus of claim 3, wherein, based on the first voltage being bigger than the second voltage, the first number is smaller than the second number.

5. The cooking apparatus of claim 4, wherein the first voltage is 240V and the second voltage is 208V.

6. The cooking apparatus of claim 1, further comprising a display,
wherein the processor is further configured to, based on the phase difference being outside the plurality of threshold ranges, control the display to display a guide message indicating that the electric wire has been wrongly connected to the plurality of power input terminals.

7. The cooking apparatus of claim 1, further comprising a speaker,
wherein the processor is further configured to, based on the phase difference being outside the plurality of threshold ranges, control the speaker to output a notification sound indicating that the electric wire has been wrongly connected to the plurality of power input terminals.

8. A method of controlling a cooking apparatus comprising a plurality of power input terminals including at least a first live terminal, a second live terminal, and a neutral terminal, a plurality of heaters, and a detection circuit connected to the plurality of power input terminals, the method comprising:
- performing half-rectification of each of a first electronic signal of the power between the first live terminal and the neutral terminal and a second electronic signal of the power between the second live terminal and the neutral terminal;
- outputting, from the detection circuit, a first square wave of the first electronic signal and a second square wave of the second electronic signal;
- detecting falling edges of the first and second square waves output from the detection circuit;
- detecting an interval between the detected falling edges of the first and second square waves;
- identifying a phase difference of the input power based on the interval;
- based on the phase difference being within one of a plurality of threshold ranges, identifying a voltage between the first live terminal and the second live terminal among the plurality of power input terminals based on the phase difference of the power and controlling to operate at least one heater among the plurality of heaters according to the identified voltage between the live terminals; and
- based on the phase difference being outside the plurality of threshold ranges, controlling to stop the operation of the cooking apparatus.

9. The method of claim 8, wherein the controlling to operate heaters comprises, based on the phase difference of the power being within a first threshold range, identifying the voltage between the live terminals as a first voltage corresponding to the first threshold range and controlling to operate heaters of a first number corresponding to the first voltage.

10. The method of claim 9, wherein the controlling to operate heaters further comprises, based on the phase difference being within a second threshold range, identifying the voltage between the live terminals as a second voltage corresponding to the second threshold range and controlling to operate heaters of a second number corresponding to the second voltage.

11. The method of claim 10, wherein, based on the first voltage being bigger than the second voltage, the first number is smaller than the second number.

12. The method of claim 11, wherein the first voltage is 240V and the second voltage is 208V.

13. The method of claim 8, wherein the controlling to stop the operation of the cooking apparatus comprises, based on the phase difference being outside the plurality of threshold ranges, displaying a guide message indicating that an electric wire has been wrongly connected to the plurality of power input terminals.

14. The method of claim 8, wherein the controlling to stop the operation of the cooking apparatus comprises, based on the phase difference being outside the plurality of threshold ranges, outputting a notification sound indicating that an electric wire has been wrongly connected to the plurality of power input terminals.

* * * * *